United States Patent
Joo et al.

(10) Patent No.: US 10,811,118 B2
(45) Date of Patent: Oct. 20, 2020

(54) TEST INTERFACE BOARDS, TEST SYSTEMS, AND METHODS OF OPERATING TEST INTERFACE BOARDS

(71) Applicant: SAMSUNG ELECTRONICS CO., LTD., Suwon-si, Gyeonggi-do (KR)

(72) Inventors: Sung-Ho Joo, Hwaseong-si (KR); Gyu-Yeol Kim, Hwaseong-si (KR); Jae-Young Lee, Hwaseong-si (KR); Chang-Hyun Cho, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 108 days.

(21) Appl. No.: 16/244,890

(22) Filed: Jan. 10, 2019

(65) Prior Publication Data
US 2019/0378590 A1    Dec. 12, 2019

(30) Foreign Application Priority Data
Jun. 12, 2018   (KR) .......................... 10-2018-0067142

(51) Int. Cl.
| | |
|---|---|
| *G01R 31/3183* | (2006.01) |
| *G11C 29/56* | (2006.01) |
| *G01R 31/317* | (2006.01) |
| *G11C 29/10* | (2006.01) |

(52) U.S. Cl.
CPC .. *G11C 29/56012* (2013.01); *G01R 31/31713* (2013.01); *G01R 31/318307* (2013.01); *G01R 31/318314* (2013.01); *G11C 29/10* (2013.01); *G11C 29/56004* (2013.01); *G11C 29/56016* (2013.01); *G11C 2029/5602* (2013.01)

(58) Field of Classification Search
CPC .............. G01R 1/0408; G01R 1/0466; G01R 1/07307; G01R 1/36; G01R 31/2893
See application file for complete search history.

(56) References Cited

U.S. PATENT DOCUMENTS

| | | |
|---|---|---|
| 6,282,682 B1 | 8/2001 | Walker et al. |
| 7,184,917 B2 | 2/2007 | Pramanick et al. |
| 7,197,416 B2 | 3/2007 | Adachi et al. |
| 7,197,417 B2 | 3/2007 | Pramanick et al. |
| 7,209,851 B2 | 4/2007 | Singh et al. |

(Continued)

FOREIGN PATENT DOCUMENTS

| | | |
|---|---|---|
| JP | 1995-198793 | 8/1995 |
| KR | 1020050113273 | 12/2005 |

*Primary Examiner* — Tung X Nguyen
(74) *Attorney, Agent, or Firm* — F. Chau & Associates, LLC

(57) ABSTRACT

A test interface board includes one or more relay circuits and a synchronization signal generator. The relay circuits duplicate a test signal from an automated test equipment (ATE), apply duplicated test signals to each of a plurality of devices under test (DUTs) through one of corresponding channels, and provide the ATE with a plurality of test result signals received from each of the DUTs in response to the duplicated test signals. The synchronization signal generator receives a plurality of status signals from each of the DUTs and provides a timing synchronization signal to the ATE. Each of the status signals indicates a completion of a test operation in one of the DUTs, the test operation is associated with the test signal, and the synchronization signal generator activates the timing synchronization signal when all of the status signals indicate the completion of the test operation.

20 Claims, 17 Drawing Sheets

(56) References Cited

U.S. PATENT DOCUMENTS

| | | |
|---|---|---|
| 7,210,087 B2 | 4/2007 | Mukai et al. |
| 7,272,765 B2 | 9/2007 | Ichiyoshi |
| 7,290,192 B2 | 10/2007 | Ichiyoshi |
| 7,319,936 B2 | 1/2008 | Reichert |
| 7,430,486 B2 | 9/2008 | Elston et al. |
| 7,437,261 B2 | 10/2008 | Pramanick et al. |
| 7,460,988 B2 | 12/2008 | Higashi |
| 7,679,391 B2 | 3/2010 | Watanabe et al. |
| 8,255,198 B2 | 8/2012 | Krishnaswamy et al. |
| 8,479,066 B2 | 7/2013 | Pagani |
| 8,593,166 B2 | 11/2013 | Watanabe et al. |
| 9,372,227 B2 | 6/2016 | Wang et al. |
| 2004/0225459 A1 | 11/2004 | Krishnaswamy et al. |
| 2005/0039079 A1 | 2/2005 | Higashi et al. |
| 2008/0010524 A1 | 1/2008 | Higashi et al. |
| 2008/0016396 A1 | 1/2008 | Higashi et al. |

TEST INTERFACE BOARDS, TEST SYSTEMS, AND METHODS OF OPERATING TEST INTERFACE BOARDS

CROSS-REFERENCE TO RELATED APPLICATION

This application claims priority under 35 U.S.C. § 119 to Korean Patent Application No. 10-2018-0067142, filed on Jun. 12, 2018 in the Korean Intellectual Property Office (KIPO), the disclosure of which is incorporated by reference herein in its entirety.

TECHNICAL FIELD

Exemplary embodiments of the inventive concept relate generally to testing of semiconductor devices, and more particularly to test interface boards, test systems, and methods of operating test interface boards.

DISCUSSION OF RELATED ART

A tester is an automated device combining hardware and software for performing an electrical test of a semiconductor device. Generally, memory semiconductor devices such as dynamic random access memories (DRAMs) have gradually increased in capacity and in number of pins. Accordingly, tests for semiconductor memory device have been developed that focus on high throughput.

When the capacity of a semiconductor memory device becomes larger, the cost for the electrical test increases because the time required for performing the electrical test increases. Thus, the tester for the semiconductor memory device may adopt a parallel testing method. The parallel testing method is a method for testing a plurality of semiconductor devices at one time, instead of testing the semiconductor devices one by one.

SUMMARY

According to an exemplary embodiment of the inventive concept, a test interface board includes one or more relay circuits and a synchronization signal generator. The one or more relay circuits duplicate a test signal from an automated test equipment (ATE), apply a plurality of duplicated test signals to each of a plurality of devices under test through one of corresponding channels, and provide the ATE with a plurality of test result signals received from each of the devices under test in response to the plurality of duplicated test signals. The synchronization signal generator receives a plurality of status signals from each of the plurality of devices under test and provides a timing synchronization signal to the ATE. Each of the plurality of status signals indicates a completion of a test operation in one of plurality of devices under test, the test operation is associated with the test signal, and the synchronization signal generator activates the timing synchronization signal when all of the plurality of status signals indicate the completion of the test operation.

According to an exemplary embodiment of the inventive concept, a test system includes an automated test equipment (ATE) to generate a test signal and a test interface board configured to receive the test signal. The test interface board duplicates the test signal, and applies a plurality of duplicated test signals to each of a plurality of devices under test through one of corresponding channels, where the plurality of devices under test are divided into a plurality of groups of devices under test, provide the ATE with a plurality of test result signals received from each of the devices under test in response to the plurality of duplicated test signals, and receive a plurality of status signals from each of the plurality of devices under test and provide a timing synchronization signal to the ATE. Each of the plurality of status signals indicates a completion of a test operation in one of plurality of devices under test, the test operation is associated with the test signal, and the timing synchronization signal is activated when all of the plurality of status signals indicate the completion of the test operation.

According to an exemplary embodiment of the inventive concept, in a method of operating a test interface board electrically connected to a plurality of devices under test, a test signal from an automated test equipment (ATE) is duplicated and a plurality of duplicated test signals are provided to each of the plurality of devices under test. A plurality of test result signals received from each of the plurality of devices under test are provided to the ATE in response to the plurality of duplicated test signals. A plurality of status signals from each of the plurality of devices under test are received and a timing synchronization signal is provided to the ATE. Each of the plurality of status signals indicates a completion of a test operation in each of plurality of devices under test, the test operation is associated with the test signal, and the timing synchronization signal is activated when all of the plurality of status signals indicate the completion of the test operation.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EMBODIMENTS

Figure 1:
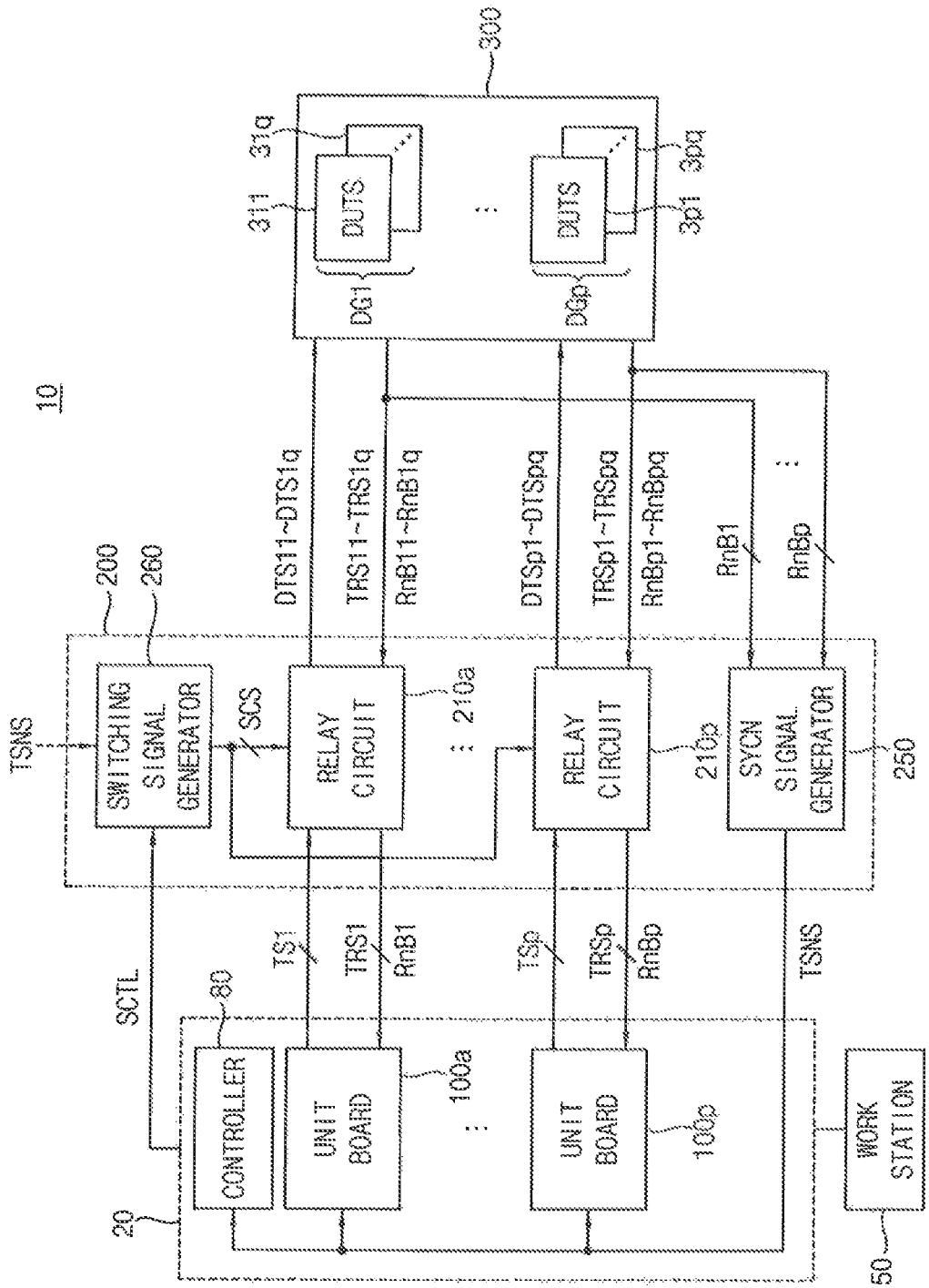
FIG. 1 is a block diagram illustrating a test system according to an exemplary embodiment of the inventive concept.

Exemplary embodiments of the inventive concept provide a test interface board capable of enhancing performance by synchronizing a test operation sequence.

Exemplary embodiments of the inventive concept also provide a test system including a test interface board capable of enhancing performance by synchronizing a test operation sequence.

Exemplary embodiments of the inventive concept further provide a method of operating a test interface board, capable of enhancing performance by synchronizing a test operation sequence.

Exemplary embodiments of the inventive concept will be described more fully hereinafter with reference to the accompanying drawings. Like reference numerals may refer to like elements throughout this application.

FIG. 1 is a block diagram illustrating a test system according to an exemplary embodiment of the inventive concept.

Referring to FIG. 1, a test system 10 includes an automated test equipment (ATE) 20, a test board 300, and a test interface board 200. The test interface board 200 may be interposed between the ATE 20 and the test board 300 and may route electrical interconnection between the ATE 20 and the test board 300.

The test system 10 may further include a workstation 50 coupled to the ATE 20. The workstation 50 may control overall operation of a series of test operations such as a function test, and implement an interface for a user and a timing calibration. The ATE 20 may perform respective test operations on a plurality of devices under test sets (DUTSs) 311~31q, . . . , 3p1~3pq (where p and q are integers greater than two) mounted on the test board 300 by executing a test program from the workstation 50.

The test board 300 may include a plurality of sockets and each of the DUTSs 311~31q, . . . , 3p1~3pq may be mounted on one of the sockets. Each of the DUTSs 311~31q, . . . , 3p1~3pq may include a plurality of DUTs. The DUTSs 311~31q, . . . , 3p1~3pq may be divided into a plurality of groups DG1~DGp.

The ATE 20 generates test signals for testing the DUTSs 311~31q, . . . , 3p1~3pq. The DUTs 311~31q, . . . , 3p1~3pq receive the test signals and operate based on the test signals.

For example, when a manufacturing process of a semiconductor device for logic or memory, electrical parameters of the semiconductor device may be measured by the ATE 20 to perform a pass/fail test of the manufactured semiconductor device. The ATE 20 may generate the test signals for performing a pass/fail test of the manufactured semiconductor device, such as DUTS 311~31q, . . . , 3p1~3pq. The DUTSs 311~31q, . . . , 3p1~3pq may perform a predetermined operation in response to the test signals received through pins.

In exemplary embodiments of the inventive concept, the DUTSs 311~31q, . . . , 3p1~3pq may generate test result signals as a result of the predetermined operation. The ATE 20 may receive the test result signals and may determine whether each of the DUTSs 311~31q, . . . , 3p1~3pq passes or fails a given test based on the test result signals.

The ATE 20 may include a controller 80 and a plurality of unit boards 100a~100p corresponding to the plurality of groups DG1~DGp. The controller 80 may control overall operation of the unit boards 100a~100p.

The test interface board 200 may include a plurality of relay circuits 210a~210p, a synchronization signal generator 250, and a switching signal generator 260. The relay circuits 210a~210p may correspond to the unit boards 100a~100p and may correspond to the plurality of groups DG1~DGp.

The unit board 100a provides a test signal TS1 to the relay circuit 210a, and the relay circuit 210a duplicates the test signal TS1 to provide a plurality of duplicated test signals DTS11~DTS1q to DUTSs 311~31q in a corresponding group DG1. The relay circuit 210a receives status signals RnB11~RnB1q and test result signals TRS11~TRS1q corresponding to the duplicated test signals DTS11~DTS1q from the DUTSs 311~31q in the group DG1, and provides the status signals RnB11~RnB1q (e.g., RnB1) and the test result signals TRS11~TRS1q (e.g., TRS1) to the corresponding unit board 100a. Each of the status signals RnB11~RnB1q may indicate a completion of a partial test operation associated with the duplicated test signals DTS11~DTS1q in each of the DUTSs 311~31q.

The unit board 100p provides a test signal TSp to the relay circuit 210p, and the relay circuit 210p duplicates the test signal TSp to provide a plurality of duplicated test signals DTSp1~DTSpq to DUTs 3p1~3pq in a corresponding group DGp. The relay circuit 210p receives status signals RnBp1~RnBpq and test result signals TRSp1~TRSpq corresponding to the duplicated test signals DTSp1~DTSpq from the DUTSs 3p1~3pq in the group DGp, and provides the status signals RnBp1~RnBpq (e.g., RnBp) and the test result signals TRSp1~TRSpq (e.g., TRSp) to the corresponding unit board 100p. Each of the status signals RnBp1~RnBpq may indicate a completion of a partial test operation associated with the duplicated test signals DTSp1~DTSpq in each of the DUTSs 3p1~3pq.

The synchronization signal generator 250 may receive status signals RnB1~RnBP from the DUTSs 311~31q, . . . , 3p1~3pq, and may simultaneously provide the unit boards 100a~100p with a timing synchronization signal TSNS based on logic levels of the status signals RnB1~RnBP. The timing synchronization signal TSNS may indicate a completion of the partial test operation in all of the DUTSs 311~31q, . . . , 3p1~3pq. The status signal RnB1 includes the status signals RnB11~RnB1q provided from the DUTSs 311~31q and the status signal RnBp includes the status signals RnBp1~RnBpq provided from the DUTSs 3p1~3pq.

The switching signal generator 260 may provide a switching control signal SCS to the relay circuits 210a~210p in response to a control signal SCTL from the controller 80 to adjust a timing of application of the test signals TS1~TSp to the DUTSs 311~31q, . . . , 3p1~3pq. The switching signal generator 260 may generate the switching control signal SCS further based on the timing synchronization signal TSNS.

The unit boards 100a~100p may perform test on the DUTSs 311~31q, . . . , 3p1~3pq in a corresponding one of the groups individually, and may synchronize a test sequence of a plurality of test items with respect to one another based on the timing synchronization signal TSNS.

Figure 2:
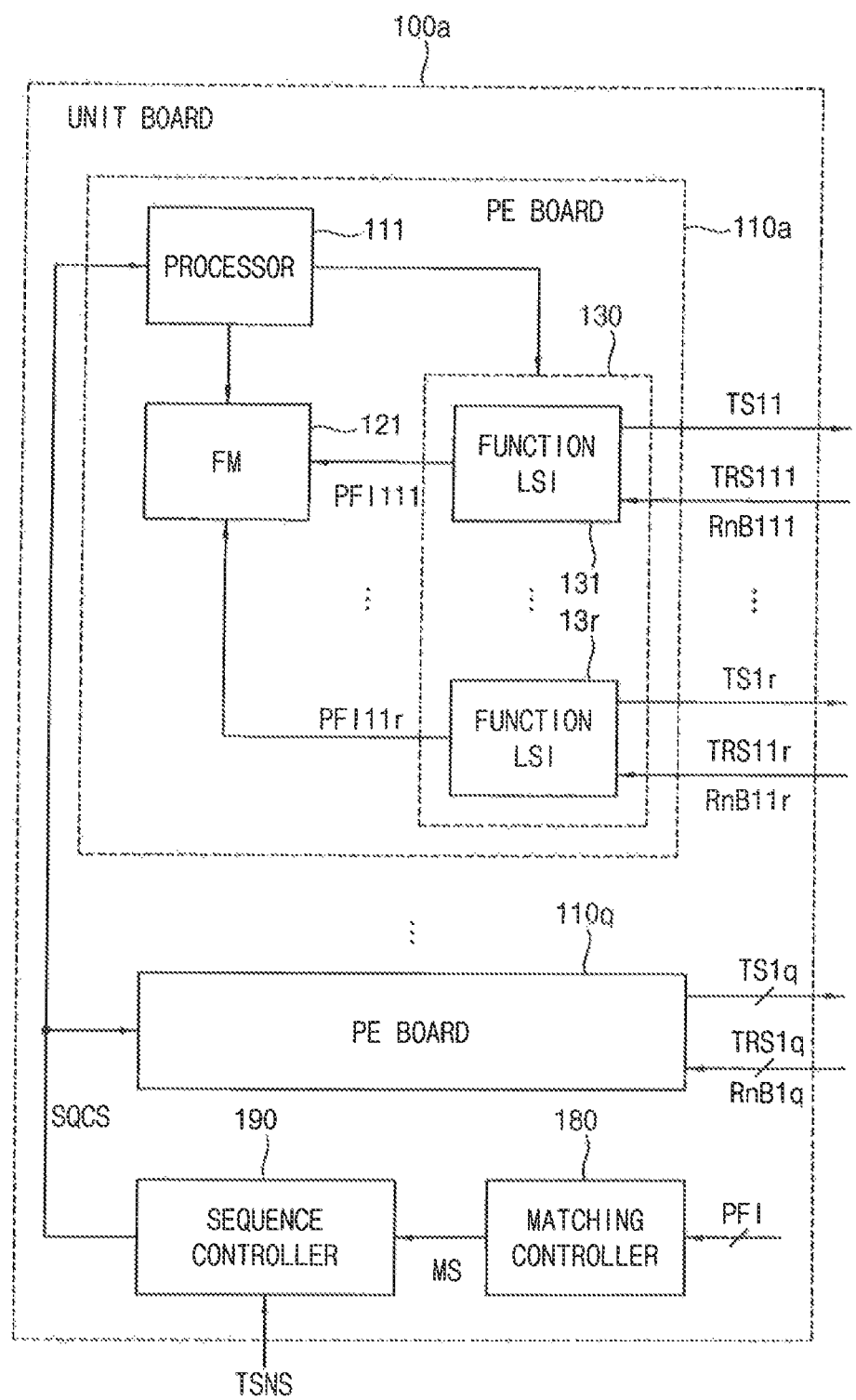
FIG. 2 is a block diagram illustrating a first unit board in the test system of FIG. 1 according to an exemplary embodiment of the inventive concept.

FIG. 2 is a block diagram illustrating a first unit board in the test system of FIG. 1 according to an exemplary embodiment of the inventive concept.

Referring to FIG. 2, the first unit board 100a may include a plurality of pin electronics (PE) boards 110a~110p, a matching controller 180, and a sequence controller 190.

Each of the PE boards 110a~110p may have substantially the same configuration with respect to one another.

In FIG. 2, it is assumed that each of the DUTSs 311~31q include r DUTs to be tested.

Here, r is an integer greater than one.

The PE board 110a outputs test signals TS11~TS1r, and receives test result signals TRS111~TRS11r and status signals RnB111~RnB11r from the DUTS 311.

The PE board 110q outputs test signals TS1q, and receives test result signals TRS1q and status signals RnB1q from the DUTS 31q.

The PE board 110a may include a processor 111, at least one fail memory 121, and a PE circuit 130. The PE circuit 130 may include a plurality of function circuits 131~13r.

The PE circuit 130 generates the test signals TS11~TS1r, receives the test result signals TRS111~TRS11r and status signals RnB111~RnB11r, generates pass/fail information PFI111~PFI11r based on the test signals TS11~TS1r and the test result signals TRS111~TRS11r, and records the pass/fail information PFI111~PFI11r in the fail memory 121. The processor 111 may control the PE circuit 130 and the fail memory 121.

The matching controller 180 may generate a match signal MS based on pass/fail information PFI provided from the PE boards 110a~110q, and the sequence controller 190 may provide a sequence control signal SQCS to the PE boards 110a~110q based on the timing synchronization signal TSNS and the match signal MS. Therefore, the PE boards 110a~110q may operate in synchronization with the sequence control signal SQCS based on the timing synchronization signal TSNS and thus, the unit boards 100a~100p may synchronize the test sequence of a plurality of test items with respect to one another.

Figure 3:
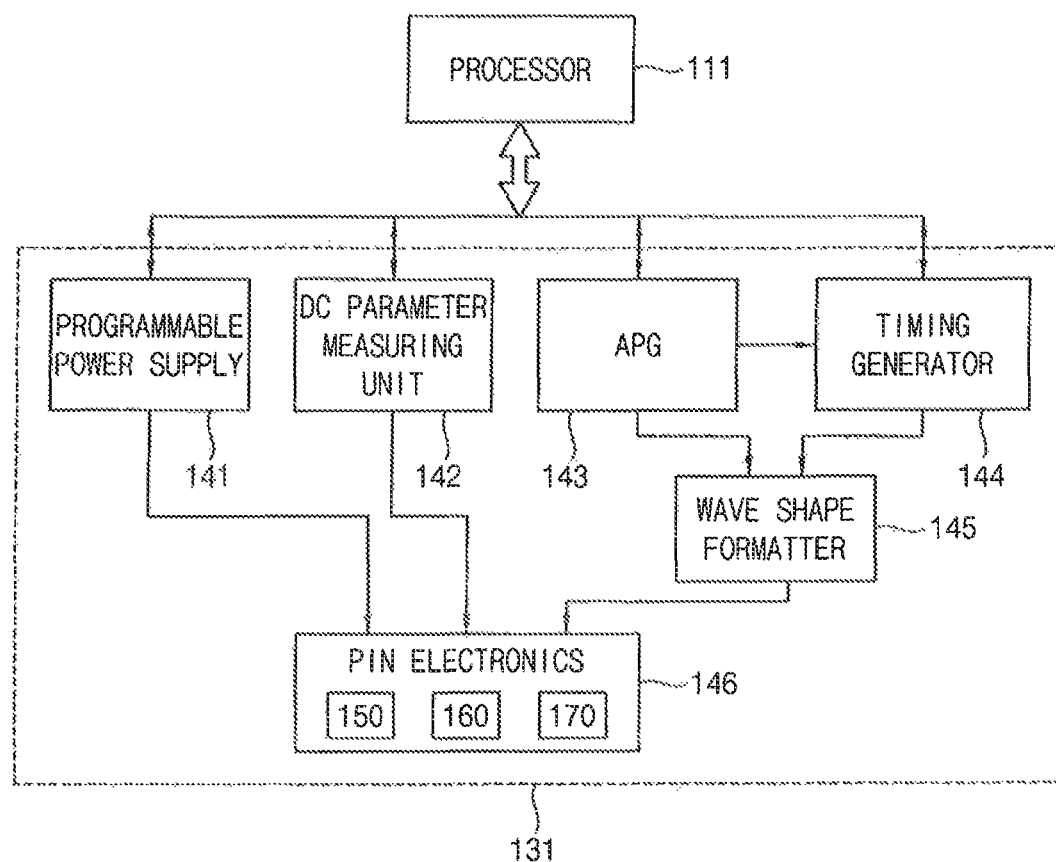
FIG. 3 is a block diagram illustrating a function circuit in FIG. 2 according to an exemplary embodiment of the inventive concept.

FIG. 3 is a block diagram illustrating a function circuit in FIG. 2 according to an exemplary embodiment of the inventive concept.

In FIG. 3, the first function circuit 131 and the processor 111 are illustrated together for convenience of explanation.

Referring to FIG. 3, the processor 111 controls hardware components of the function circuit 131. In exemplary embodiments of the inventive concept, the hardware components include a programmable power supply 141, a DC parameter measurement unit 142, an algorithmic pattern generator 143, a timing generator 144, a wave shape formatter 145, pin electronics 146, and the like. The pin electronics 146 includes a driver channel 150, an I/O channel 160, and a power channel 170. In the function circuit 131, a test program running on the processor 111 communicates signals and electrically tests functions of the DUTS 311 connected via the pin electronics 146.

A test program for testing the DUTS 311 may include a DC test, an AC test, and a function test, for example. The function test may operate to check the functionality of a semiconductor memory device, for example a DRAM, under its actual operational condition. In other words, in some test program configurations, an input pattern from the algorithmic pattern generator 143 of the function circuit 131 is written to the DUTS 311, for example, a flash memory device (write operation), and a returned output pattern from the flash memory device is read out (read operation) and compared by the function circuit 131 to an expected return pattern by a comparator (compare operation) to ensure proper functioning of the flash memory device.

The DC test may be employed to test leakage current of the DUTS 311. In the leakage test, currents are measured on every pin of the DUTS 311 after applying voltages to the pins, or the voltages are measured after applying the currents. The leakage test is for checking stability of power supply wiring for the connecting path, checking required current, and measuring the leaked current in the DUTS 311 and in the function circuit 131, for example.

The AC test may be employed to check timing of the DUTS 311. The timing test is for checking pulses of an output terminal after applying pulses to an input terminal of the DUTS 311 to check input/output propagation delay time, for example. If there is an element which may cause propagation delay in hardware within the DUTS 311, the element can be identified by the timing test and, in particular, unexpected delays and their associated elements may be identified.

Figure 4:
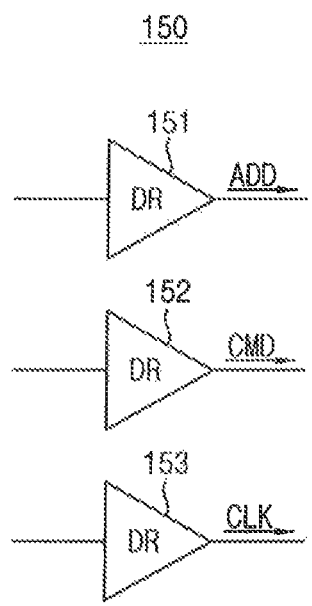
FIG. 4 illustrates a driver channel in FIG. 3 according to an exemplary embodiment of the inventive concept.

FIG. 4 illustrates a driver channel in FIG. 3 according to an exemplary embodiment of the inventive concept.

Referring to FIG. 4, the driver channel 150 may include a plurality of drivers 151, 152, and 153. The driver 151 provides an address signal ADD, the driver 152 provides a command signal CMD, and the driver 153 provides a clock signal CLK. The driver channel 150 includes uni-directional channels for providing the address signal ADD, the command signal CMD, and the clock signal CLK to the corresponding pins of the DUTS 311.

Figure 5:
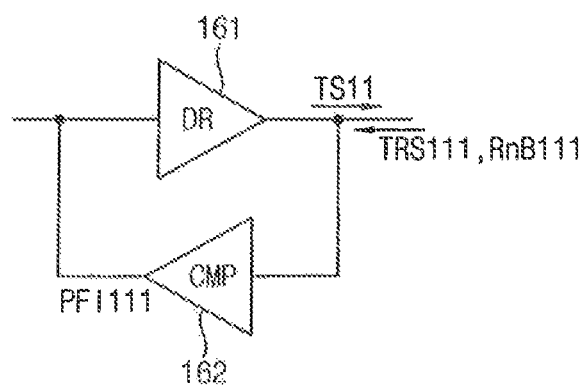
FIG. 5 illustrates an I/O channel in FIG. 3 according to an exemplary embodiment of the inventive concept.

FIG. 5 illustrates an I/O channel in FIG. 3 according to an exemplary embodiment of the inventive concept.

Referring to FIG. 5, the I/O channel 160 may include a driver 161 and a comparator 162. The driver 161 may provide the DUTs 311 with the test signal TS11 provided from the algorithmic pattern generator 143 and the wave shape formatter 145, for example. The comparator 162 receives the test result signal TRS111 from one of the DUTS 311, compares the test result signal TRS111 with the test signal TS111, and outputs the pass/fail information PFI111 having a logic level according to a result of the comparison.

For example, the comparator 162 may output the pass/fail information PFI111 having a first logic level (e.g., logic high level) when the test result signal TRS111 matches with the test signal TS11. The comparator 162 may output the pass/fail information PFI111 having a second logic level (e.g., logic low level) when the test result signal TRS111 does not match with the test signal TS111.

Therefore, the function circuit 131 may determine whether the DUTS 311 pass or fail based on the pass/fail information PFI. Therefore, the I/O channel 160 may include bi-directional channels for providing the test signal TS111 to one of the DUTS 311 and receiving the test result signal TRS111 from one of the DUTS 311.

Figure 6:
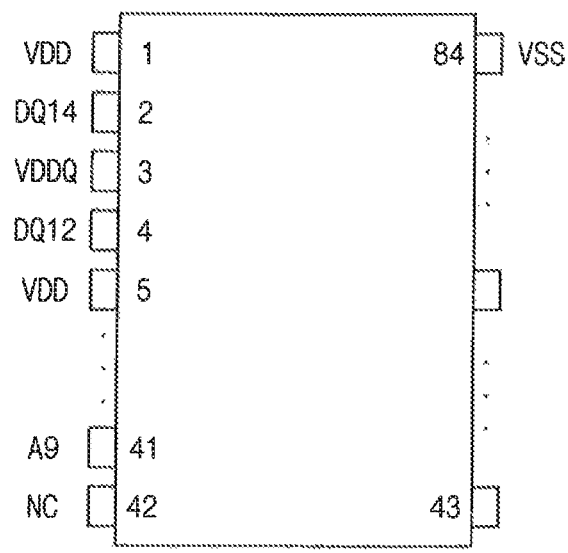
FIG. 6 illustrates a pin configuration of one DUT of DUTS in FIG. 1 according to an exemplary embodiment of the inventive concept.

FIG. 6 illustrates a pin configuration of one DUT of DUTS in FIG. 1 according to an exemplary embodiment of the inventive concept.

Referring to FIG. 6, a DUT 3111, one DUT of the DUTS 311, is a semiconductor device having 84 pins. The plurality of pins may include power supply voltage pins VDD, data pins DQ, address pins A, ground voltage pins VSS, and non-connection pins NC, for example. The ATE 20 may provide a plurality of powers to each of the power supply voltage pins VDD when the test is performed.

Figure 7:
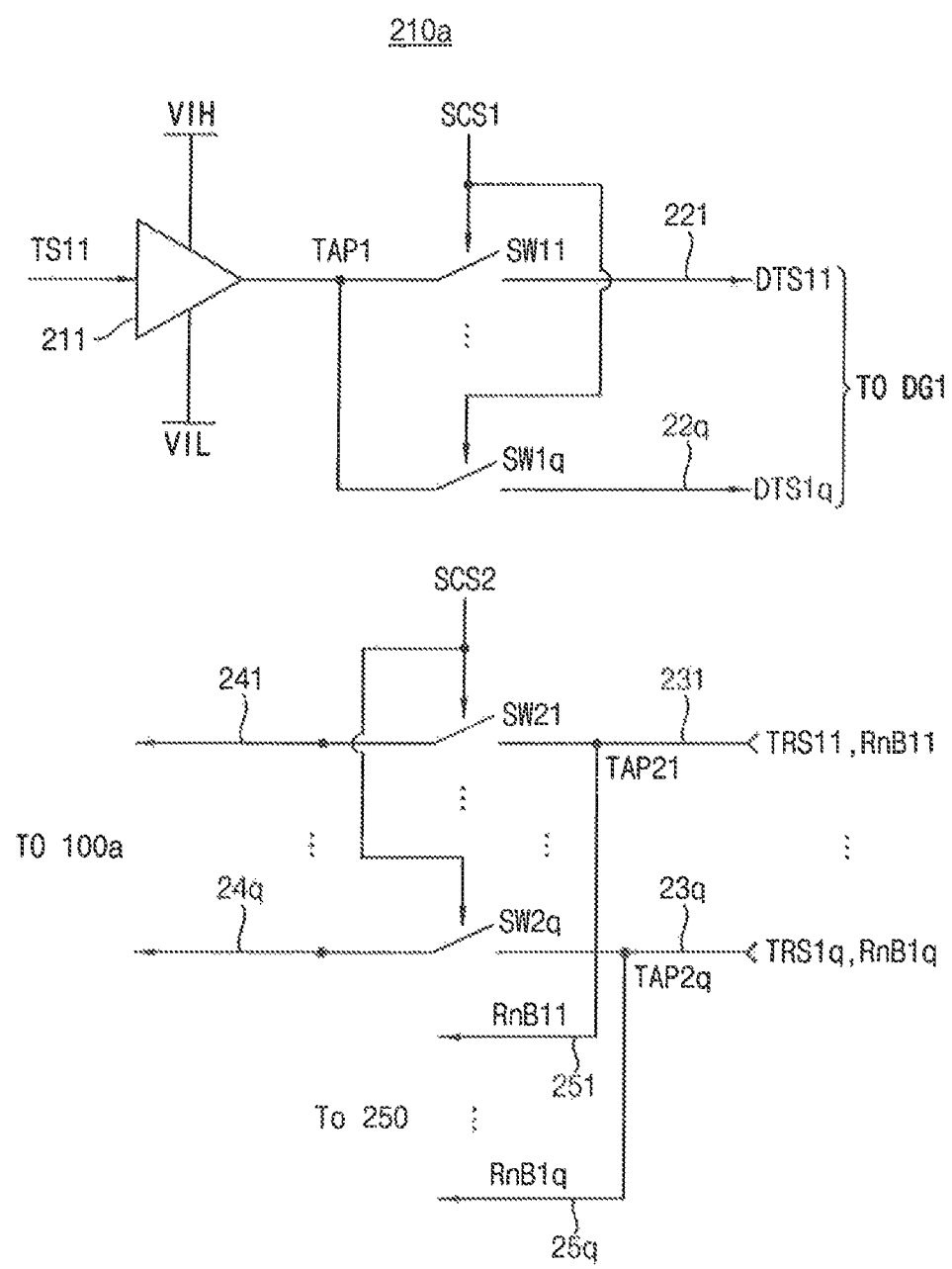
FIG. 7 is a circuit diagram illustrating a relay circuit in a test interface board in FIG. 1 according to an exemplary embodiment of the inventive concept.

FIG. 7 is a circuit diagram illustrating a relay circuit in a test interface board in FIG. 1 according to an exemplary embodiment of the inventive concept.

In FIG. 7, a configuration of the relay circuit 210a is illustrated, and each configuration of the relay circuits 210b~210p may be substantially the same as the configuration of the relay circuit 210a.

Referring to FIG. 7, the relay circuit 210a may include a buffer 211, first relays SW11~SW1q, first wiring lines 221~22q, second relays SW21~SW2q, second wiring lines 241~24q, third wiring lines 251~25q, and fourth wiring lines 231~23q.

The buffer 211 duplicates the test signal TS11 to output the duplicated test signals DTS11~DTS1q. The buffer 211 is provided with first and second power supply voltages VIH and VIL, and a level of the first power supply voltage VIH is higher than a level of the second power supply voltage VIL. Levels of the first and second power supply voltages VIH and VIL may be adjusted externally, and thus, the duplicated test signals DTS11~DTS1q may be adjusted to have a voltage level ranging between the first and second power supply voltages VIH and VIL. When the voltage level of the test signal TS11 does not have a sufficient level margin, the duplicated test signals DTS11~DTS1q may be adjusted to provide sufficient level margin by adjusting the levels of the first and second power supply voltages VIH and VIL.

First terminals of the first relays SW11~SW1q are coupled to an output of the buffer 211 at a tap TAP1, and second terminals of the first relays SW11~SW1q are coupled to the first wiring lines 221~22q, respectively. The first relays SW11~SW1q provide the duplicated test signals DTS11~DTS1q to the DUTSs 311~31q in the first group DG1 through the first wiring lines 221~22q, in response to a first switching control signal SCS1.

The first wiring lines 221~22q are coupled to the DUTSs 311~31q through contacts. The contacts may be needles or pogo pins according to a shape of the DUTSs 311~31q. When the DUTSs 311~31q correspond to a semiconductor die or a semiconductor wafer, the contacts may be needles. In this case, the test interface board 200 may be a probe card. When the DUTSs 311~31q correspond to semiconductor package, the contacts may be pogo pins. In additions, the contacts may correspond to pins of a socket on which the DUTSs 311~31q are mounted. In this case, the test interface board 200 may be a Hi-Fix board.

First terminals of the second relays SW21~SW2q are coupled to the third wiring lines 251~25q and the fourth wiring lines 231~23q at taps TAP21~TAP2q, respectively and the second terminals of the second relays SW21~SW2q are coupled to the second wiring lines 241~24q. The third wiring lines 251~25q and the fourth wiring lines 231~23q are coupled in parallel with respect to the taps TAP21~TAP2q. The DUTSs 311~31q provide the test result signals TRS11~TRS1q and the status signals RnB11~RnB1q to the second relays SW21~SW2q through the fourth wiring lines 231~23q.

The second relays SW21~SW2q provide the unit board 100a in the ATE 20 with the test result signals TRS11~TRS1q and the status signals RnB11~RnB1q from the DUTSs 311~31q in the first group DG1 through the second wiring lines 241~24q, in response to a second switching control signal SCS2. The status signals RnB11~RnB1q may be provided to the synchronization signal generator 250 through the third wiring lines 251~25q.

The switching signal generator 260 in FIG. 1 may provide the first switching control signal SCS1 and the second switching control signal SCS2.

Figure 8:
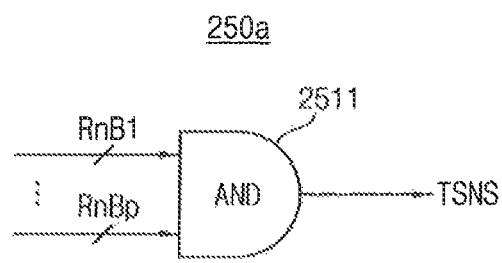
FIG. 8 is a block diagram illustrating a synchronization signal generator in FIG. 1 according to an exemplary embodiment of the inventive concept.

FIG. 8 is a block diagram illustrating a synchronization signal generator in FIG. 1 according to an exemplary embodiment of the inventive concept.

Referring to FIG. 8, a synchronization signal generator 250a may include an AND gate 2511.

The AND gate 2511 receives the status signals RnB1~RnBp from all of the DUTSs 311~31q, . . . , 3p1~3pq, and performs an AND operation on the plurality of status signals status signals RnB1~RnBp to output the timing synchronization signal TSNS. Therefore, the timing synchronization signal TSNS may be activated with a high level when all of the status signals RnB1~RnBp have a high level.

Figure 9:
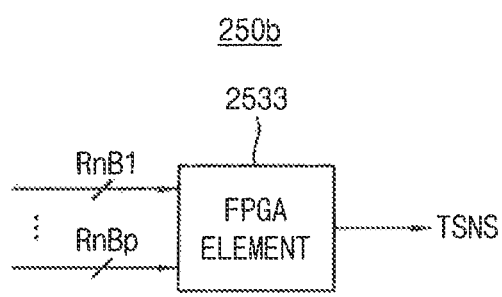
FIG. 9 is a block diagram illustrating a synchronization signal generator in FIG. 1 according to an exemplary embodiment of the inventive concept.

FIG. 9 is a block diagram illustrating a synchronization signal generator in FIG. 1 according to an exemplary embodiment of the inventive concept.

Referring to FIG. 9, a synchronization signal generator 250b may include a field programmable gate array (FPGA) element 2533.

The FPGA element 2533 receives the status signals RnB1~RnBp from all of the DUTSs 311~31q, . . . , 3p1~3pq, and is configured to perform an AND operation on the plurality of status signals status signals RnB1~RnBp to output the timing synchronization signal TSNS. Therefore, the timing synchronization signal TSNS may be activated with a high level when all of the status signals RnB1~RnBp have a high level. The FPGA element 2533 may be programmable based on a number of the DUTSs 311~31q, . . . , 3p1~3pq in a field.

Figure 10:
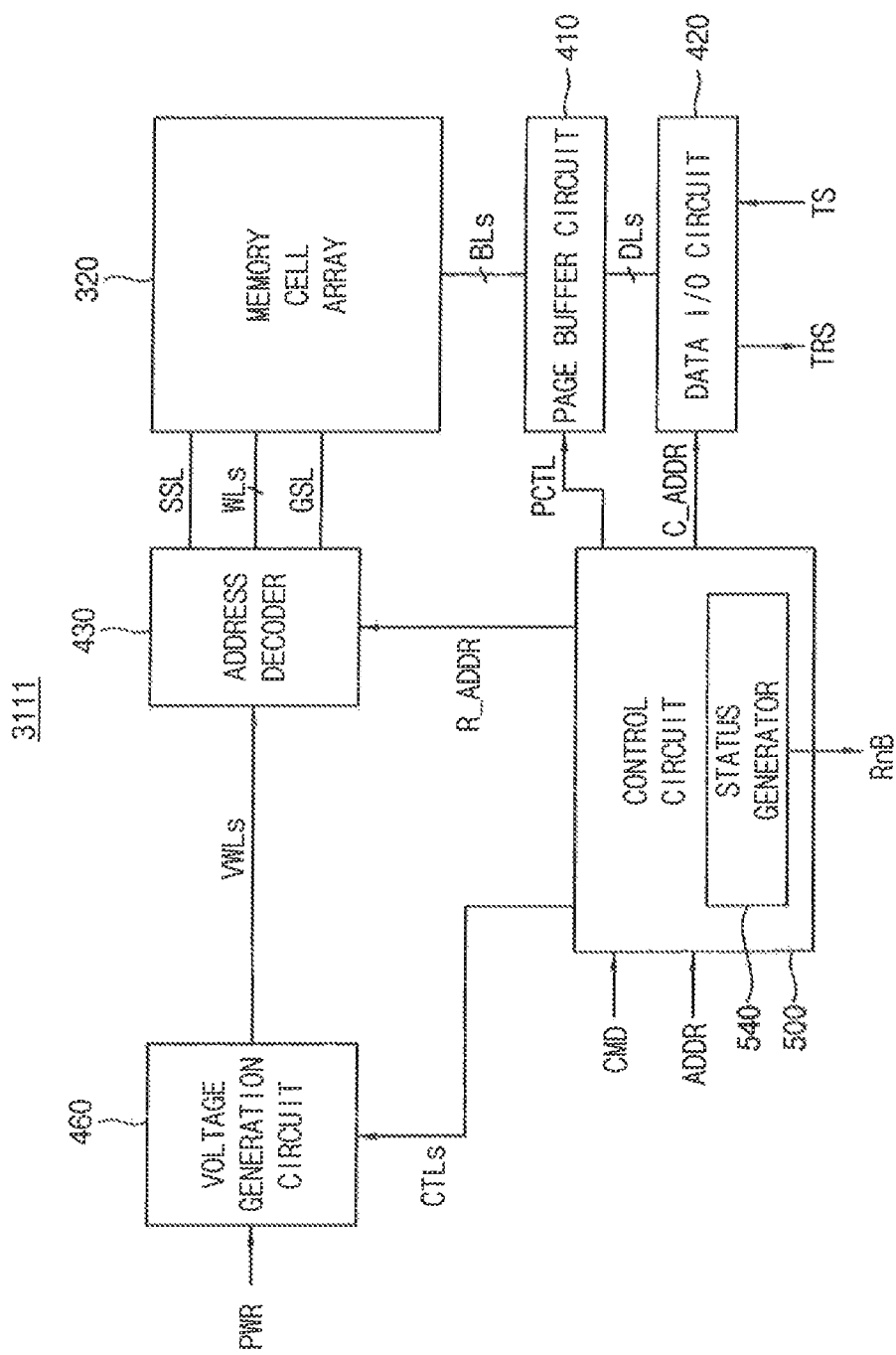
FIG. 10 is a block diagram illustrating a DUT in FIG. 1 according to an exemplary embodiment of the inventive concept.

FIG. 10 is a block diagram illustrating a DUT in FIG. 1 according to an exemplary embodiment of the inventive concept.

In FIG. 10, it is assumed that the DUT 3111 is a non-volatile memory device.

Referring to FIG. 10, the nonvolatile memory device 3111 includes a memory cell array 320, an address decoder 430, a page buffer circuit 410, a data input/output circuit 420, a control circuit 500, and a voltage generation circuit 460.

The memory cell array 320 may be coupled to the address decoder 430 through a string selection line SSL, a plurality of word-lines WLs, and a ground selection line GSL. In addition, the memory cell array 320 may be coupled to the page buffer circuit 410 through a plurality of bit-lines BLs. The memory cell array 320 may include a plurality of nonvolatile memory cells coupled to the plurality of word-lines WLs and the plurality of bit-lines BLs. The plurality of nonvolatile memory cells may be arranged in the memory cell array 320.

In exemplary embodiments of the inventive concept, the memory cell array 320 may be a three-dimensional memory cell array, which is formed on a substrate in a three-dimensional structure (or a vertical structure). In this case, the memory cell array 320 may include vertical cell strings stacked in vertical direction so that at least one memory cell is located over another memory cell. The following patent documents, which are incorporated by reference herein in their entireties, describe suitable configurations for three-dimensional memory cell arrays: U.S. Pat. Nos. 7,679,133, 8,553,466, 8,654,587, and 8,559,235, and U.S. Pat. Pub. No. 2011/0233648.

In exemplary embodiments of the inventive concept, the memory cell array 320 may be a two-dimensional memory cell array, which is formed on a substrate in a two-dimensional structure (or a horizontal structure).

Figure 11:
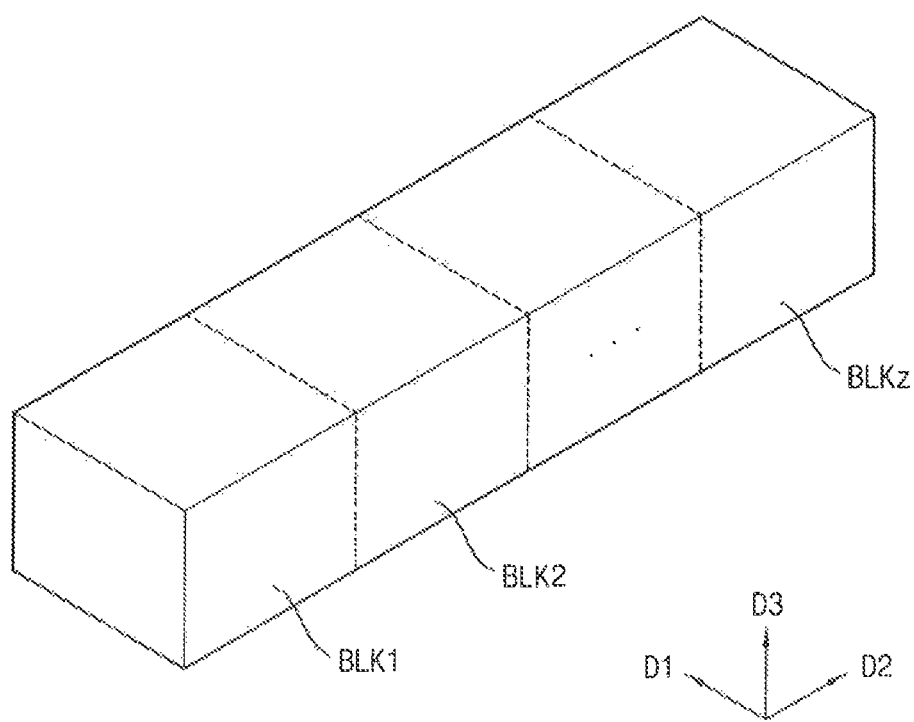
FIG. 11 is a block diagram illustrating a memory cell array in FIG. 10 according to an exemplary embodiment of the inventive concept.

FIG. 11 is a block diagram illustrating a memory cell array in FIG. 10 according to an exemplary embodiment of the inventive concept.

Referring to FIG. 11, the memory cell array 320 may include a plurality of memory blocks BLK1 to BLKz extending in first through third directions D1, D2, and D3. In an exemplary embodiment of the inventive concept, the memory blocks BLK1 to BLKz are selected by the address decoder 430 in FIG. 10. For example, the address decoder 430 may select a memory block BLKi corresponding to a block address among the memory blocks BLK1 to BLKz.

Figure 12:
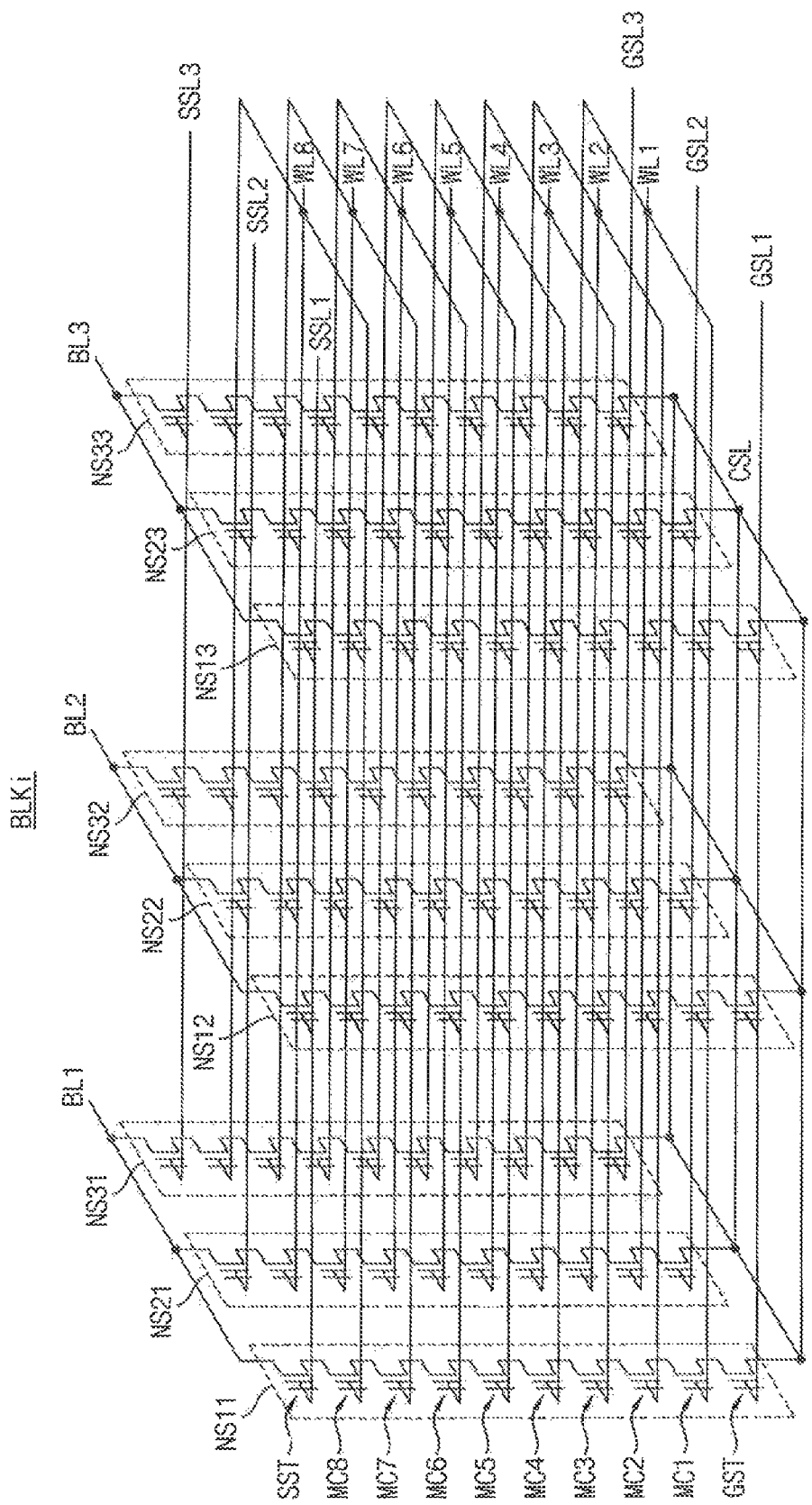
FIG. 12 is a circuit diagram illustrating an equivalent circuit of a memory block described with reference to FIG. 11 according to an exemplary embodiment of the inventive concept.

FIG. 12 is a circuit diagram illustrating an equivalent circuit of a memory block described with reference to FIG. 11 according to an exemplary embodiment of the inventive concept.

The memory block BLKi of FIG. 12 may be formed on a substrate in a three-dimensional structure (or a vertical structure). For example, a plurality of memory cell strings included in the memory block BLKi may be formed in a direction perpendicular to the substrate.

Referring to FIG. 12, the memory block BLKi may include memory cell strings NS11 to NS33 coupled between bit-lines BL1, BL2, and BL3 and a common source line CSL. Each of the memory cell strings NS11 to NS33 may include a string selection transistor SST, a plurality of memory cells MC1 to MC8, and a ground selection transistor GST. In FIG. 12, each of the memory cell strings NS11 to NS33 is illustrated to include eight memory cells MC1 to MC8. However, the inventive concept is not limited thereto. In exemplary embodiments of the inventive concept, each of the memory cell strings NS11 to NS33 may include any number of memory cells.

The string selection transistor SST may be connected to corresponding string selection lines SSL1 to SSL3. The plurality of memory cells MC1 to MC8 may be connected to corresponding word-lines WL1 to WL8, respectively. The ground selection transistor GST may be connected to corresponding ground selection lines GSL1 to GSL3. The string selection transistor SST may be connected to corresponding bit-lines BL1, BL2, and BL3, and the ground selection transistor GST may be connected to the common source line CSL.

Word-lines (e.g., WL1) having substantially the same height may be commonly connected, and the ground selection lines GSL1 to GSL3 and the string selection lines SSL1 to SSL3 may be separated. In FIG. 12, the memory block BLKi is illustrated to be coupled to eight word-lines WL1 to WL8 and three bit-lines BL1 to BL3. However, the inventive concept is not limited thereto. In exemplary embodiments of the inventive concept, the memory cell array 320 may be coupled to any number of word-lines and bit-lines.

Referring back to FIG. 10, the control circuit 500 may receive the command (signal) CMD and the address (signal) ADDR from the ATE 20 and control an erase loop, a program loop, and a read operation of the nonvolatile memory device 3111 based on the command signal CMD and the address signal ADDR. The program loop may include a program operation and a program verification operation. The erase loop may include an erase operation and an erase verification operation. The read operation may include a normal read operation and a data recover read operation.

For example, the control circuit 500 may generate control signals CTLs, which are used for controlling the voltage generation circuit 460, based on the command signal CMD, and generate a row address R_ADDR and a column address C_ADDR based on the address signal ADDR. The control circuit 500 may provide the row address R_ADDR to the address decoder 430 and provide the column address C_ADDR to the data input/output circuit 420.

The address decoder 430 may be coupled to the memory cell array 100 through the string selection line SSL, the plurality of word-lines WLs, and the ground selection line GSL. During the program operation or the read operation, the address decoder 430 may determine one of the plurality of word-lines WLs as a selected word-line and determine the rest of the plurality of word-lines WLs, except for the selected word-line, as unselected word-lines based on the row address R_ADDR.

The voltage generation circuit 460 may generate word-line voltages VWLs, which are used for the operation of the nonvolatile memory device 3111 using power PWR from the ATE 20 or the power supply voltage VDD, based on the control signals CTLs from the control circuit 500. The word-line voltages VWLs may be applied to the plurality of word-lines WLs through the address decoder 430.

For example, during the erase operation, the voltage generation circuit 460 may apply an erase voltage to a well of the memory block and may apply a ground voltage to entire word-lines of the memory block. During the erase verification operation, the voltage generation circuit 460 may apply an erase verification voltage to the entire word-lines of the memory block or sequentially apply the erase verification voltage to word-lines on a word-line basis.

For example, during the program operation, the voltage generation circuit 460 may apply a program voltage to the selected word-line and may apply a program pass voltage to the unselected word-lines. In addition, during the program verification operation, the voltage generation circuit 460 may apply a program verification voltage to the selected word-line and may apply a verification pass voltage to the unselected word-lines.

In addition, during the read operation, the voltage generation circuit 460 may apply a read voltage to the selected word-line and may apply a read pass voltage to the unselected word-lines.

The page buffer circuit 410 may be coupled to the memory cell array 320 through the plurality of bit-lines BLs. The page buffer circuit 410 may include a plurality of page buffers. In exemplary embodiments of the inventive concept, one page buffer may be connected to one bit-line. In exemplary embodiments of the inventive concept, one page buffer may be connected to two or more bit-lines.

The page buffer circuit 410 may temporarily store data to be programmed in a selected page during the program operation or data read out from the selected page during the read operation. The page buffer circuit 410 may operate in response to a control signal PCTL from the control circuit 500.

The data input/output circuit 420 may be coupled to the page buffer circuit 410 through data lines DLs.

During the program operation, the data input/output circuit 420 may receive a test signal TS from the ATE 20 and provide the test signal TS to the page buffer circuit 410 based on the column address C_ADDR received from the control circuit 500. During the read operation, the data input/output circuit 420 may provide read data, which are stored in the page buffer circuit 410, as a test result signal TRS to the ATE 20 based on the column address C_ADDR received from the control circuit 500.

In addition, the page buffer circuit 410 and the data input/output circuit 420 read data from a first area of the memory cell array 320 and write the read data to a second area of the memory cell array 320. In other words, the page buffer circuit 410 and the data input/output circuit 420 may perform a copy-back operation.

The control circuit 500 includes a status signal generator 540 and the status signal generator 540 outputs the status signal RnB which is activated when a partial test operation associated with the test signal TS is completed.

Figure 13:
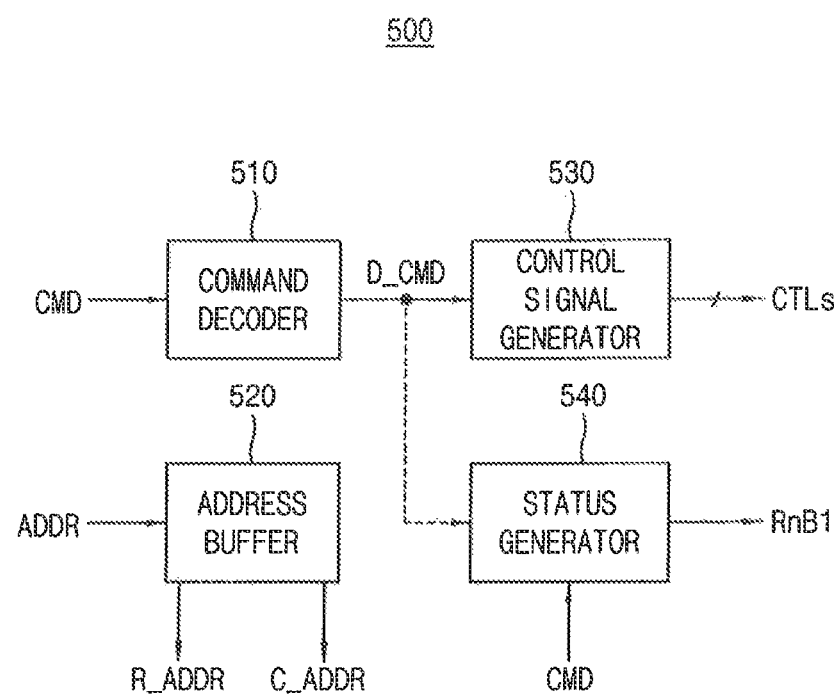
FIG. 13 is a block diagram illustrating a control circuit in the DUT of FIG. 10 according to an exemplary embodiment of the inventive concept.

FIG. 13 is a block diagram illustrating a control circuit in the DUT of FIG. 10 according to an exemplary embodiment of the inventive concept.

Referring to FIG. 13, the control circuit 500 includes a command decoder 510, an address buffer 520, a control signal generator 530, and the status signal generator 540.

The command decoder 510 decodes the command CMD and provides a decoded command D_CMD to the control signal generator 530. The command decoder 510 also provides the decoded command D_CMD to the status signal generator 540.

The address buffer 520 receives the address signal ADDR, provides the row address R_ADDR to the address decoder 430, and provides the column address C_ADDR to the data input/output circuit 420.

The control signal generator 530 receives the decoded command D_CMD, generates the control signals CTLs based on an operation directed by the decoded command D_CMD, and provides the control signals CTLs to the voltage generation circuit 460.

The status signal generator 540 generate the status signal RnB1 indicating the operating state of the nonvolatile memory device 3111 based on one of the command CMD and the decoded command D_CMD, and provides the status signal RnB1 to the synchronization signal generator 250 in the test interface board 200.

For example, the status signal generator 540 outputs the status signal RnB1 with a low level to indicate the busy state of the nonvolatile memory device 3111 when the nonvolatile memory device 3111 performs a memory operation such as program operation, a read operation, and an erase operation. The status signal generator 540 outputs the status signal RnB1 with a high level to indicate the ready state of the nonvolatile memory device 3111 when the nonvolatile memory device 3111 does not perform the memory operation.

For example, the status signal generator 540 outputs the status signal RnB1 with a high level to indicate the ready state of the nonvolatile memory device 3111 when the nonvolatile memory device 3111 completes the program operation and the read operation on one page in the memory cell array 320, which are associated with the test signal TS.

Figure 14:
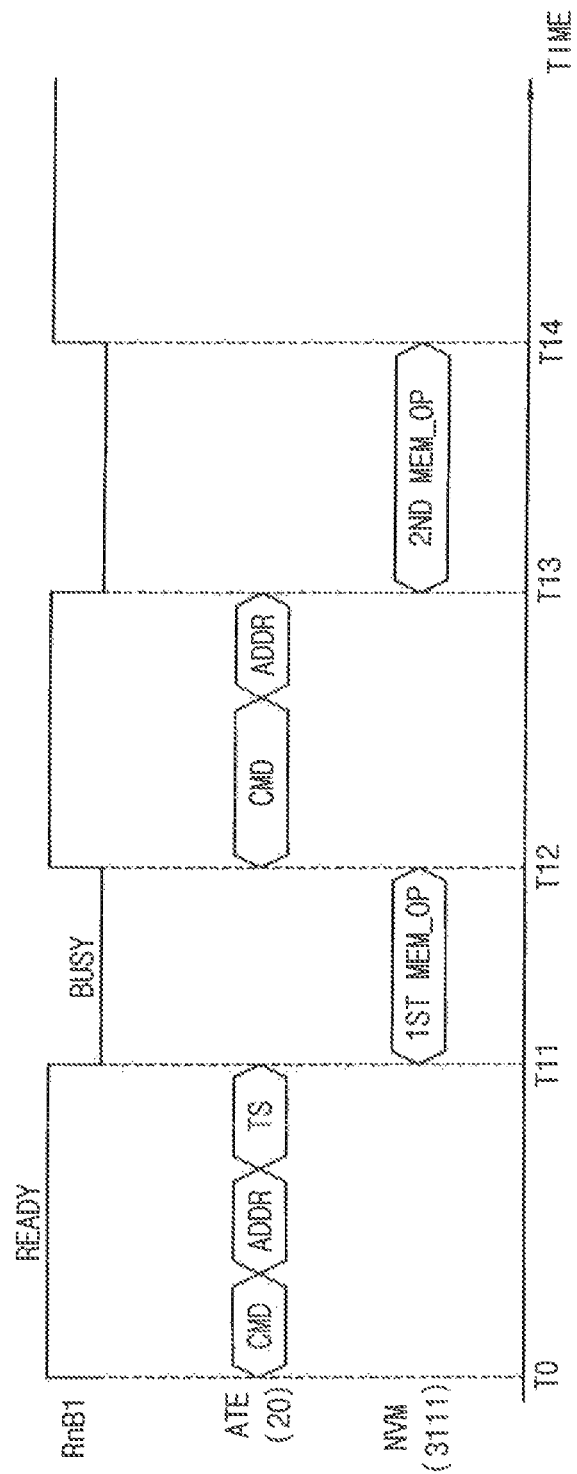
FIG. 14 is a timing diagram illustrating an operation of the DUT of FIG. 10 according to an exemplary embodiment of the inventive concept.

FIG. 14 is a timing diagram illustrating an operation of the DUT of FIG. 10 according to an exemplary embodiment of the inventive concept.

Referring to FIGS. 1 and 10 through 14, the ATE 20 transfers the command CMD, the address ADDR, and the test signal TS to the nonvolatile memory device 3111 between timings T0 and T11 in which the status signal RnB1 is a ready state. The nonvolatile memory device 3111 performs a first memory operation in response to the command CMD, the address ADDR, and the test signal TS between timings T11 and T12. The first memory operation may be a program operation to program the test signal TS in the memory cell array 320 and the status signal RnB1 is set to a low level indicating a busy state while the first memory operation is performed.

The first memory operation is completed at the timing T12, and the status signal RnB1 is set to a high level indicating a ready state. When the status signal RnB1 is a high level between timings T12 and T13, the ATE 20 transmits, to the nonvolatile memory device 3111, the command CMD and the address ADDR which direct a second memory operation. The nonvolatile memory device 3111 performs the second memory operation between timings T13 and T14. The second memory operation may be a read operation to read the test signal TS from the memory cell array 320 to provide the test result signal TRS, and the status signal RnB1 is set to a low level indicating a busy state while the second memory operation is performed.

When the second memory operation is completed at a timing T14, the status signal RnB1 is set to a high level. The test result signal TRS is provided to the test interface board 200 and the status signal RnB1 with a high level is provided to the synchronization signal generator 250 after the timing T14.

In FIGS. 10 through 14, descriptions are provided where each DUT in the DUTSs 311~31q, . . . , 3p1~3pq is a nonvolatile memory device. In exemplary embodiments of the inventive concept, each DUT in the DUTSs 311~31q, . . . , 3p1~3pq is a semiconductor memory device which is capable of providing the synchronization signal generator 250 and the ATE 20 with a status signal indicating a completion of a specific operation.

For example, when a volatile memory device such as DRAM is capable of outputting the status signal, each of the DUTSs 311~31q, . . . , 3p1~3pq may be a DRAM. Therefore, in exemplary embodiments of the inventive concept, each of the DUTSs 311~31q, . . . , 3p1~3pq may be any semiconductor device capable of outputting a status signal.

Figure 15:
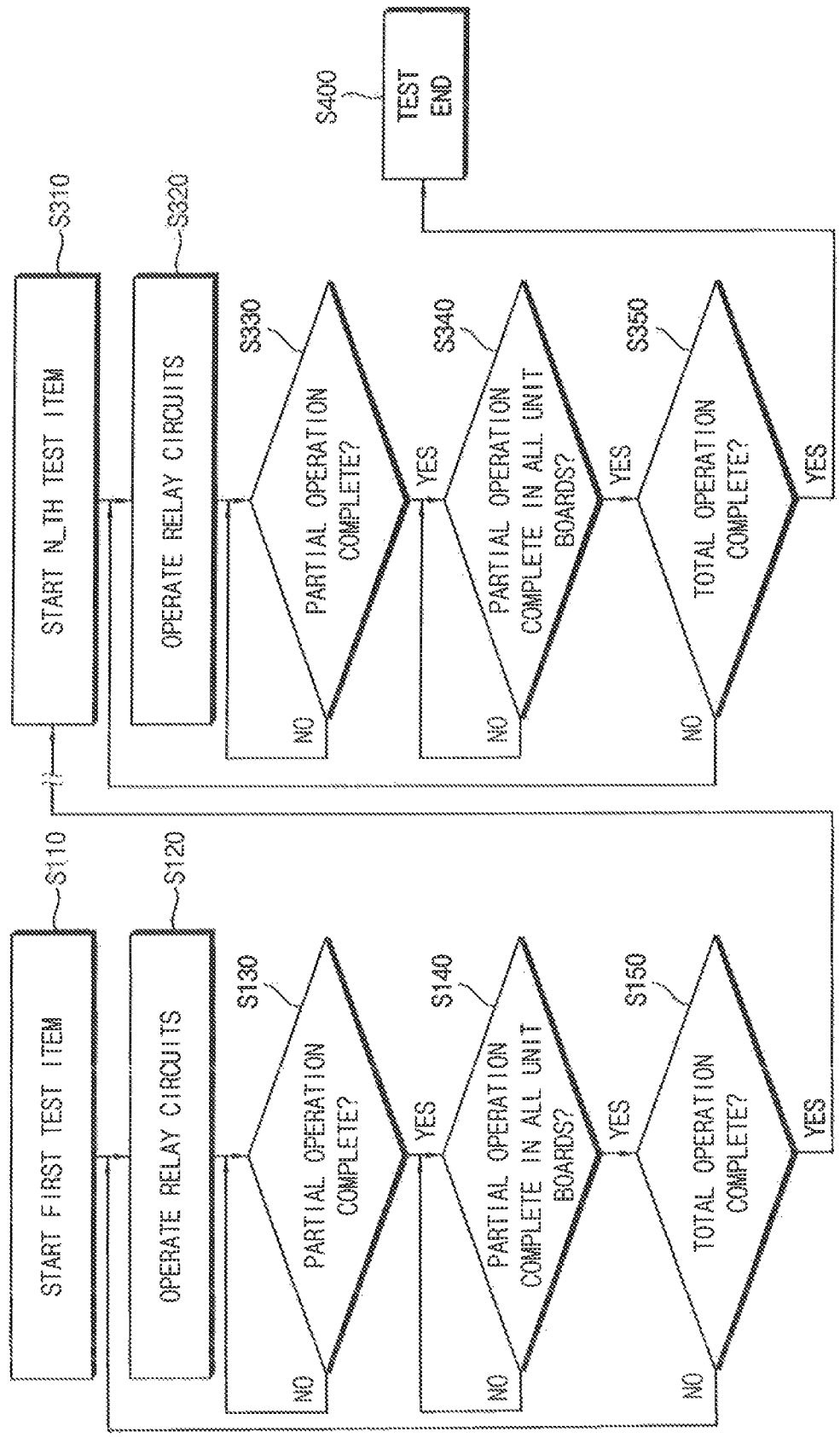
FIG. 15 is a flowchart illustrating a test operation in a test system according to an exemplary embodiment of the inventive concept.

FIG. 15 is a flowchart illustrating a test operation in a test system according to an exemplary embodiment of the inventive concept.

Referring to FIGS. 1 through 15, a test starts for a first test item (S110). The relay circuits 210a~210p duplicate the test signals TS1~TSp to provide duplicated test signals DTS11~DTS1q, . . . , DTSp1~DTSpq to the DUTSs 311~31q, . . . , 3p1~3pq (S120).

The synchronization signal generator 250 in the test interface board 200 determines whether a first partial test operation is completed on the first test item based on logic levels of the status signals RnB1~RnBp (S130).

When the first partial test operation is not completed on the first test item (NO in S130), the test returns to operation S130. When the first partial test operation is completed on the first test item (YES in S130), the controller 80 in the ATE 20 determines whether the first partial test operation associated with the first test item is completed in all of the unit boards 100a~100p based on the timing synchronization signal TSNS (S140).

When the first partial test operation associated with the first test item is not completed in all of the unit boards 100a~100p (NO in S140), the test returns to operation S140. When the first partial test operation associated with the first test item is completed in all of the unit boards 100a~100p (YES in S140), the ATE 20 determines whether total test operation associated with the first test item is completed (S150).

When the total test operation associated with the first test item is not completed (NO in S150), a second partial test operation is performed on the first test item. When the total test operation associated with the first test item is completed (YES in S150), the above-mentioned process is repeated, and a test starts for an N_th test item (S310).

The relay circuits 210a~210p duplicate the test signals TS1~TSp to provide duplicated test signals DTS11~DTS1q, . . . , DTSp1~DTSpq to the DUTSs 311~31q, . . . , 3p1~3pq (S320).

The synchronization signal generator 250 in the test interface board 200 determines whether a first partial test operation is completed on the N_th test item based on logic levels of the status signals RnB1~RnBp (S330).

When the first partial test operation is not completed on the N_th test item (NO in S330), the test returns to operation S330. When the first partial test operation is completed on the N_th test item (YES in S330), the controller 80 in the ATE 20 determines whether the first partial test operation associated with the N_th test item is completed in all of the unit boards 100a~100p based on the timing synchronization signal TSNS (S340).

When the first partial test operation associated with the N_th test item is not completed in all of the unit boards 100a~100p (NO in S340), the test returns to operation S340. When the first partial test operation associated with the N_th test item is completed in all of the unit boards 100a~100p (YES in S340), the ATE 20 determines whether a total test operation associated with the N_th test item is completed (S350).

When the total test operation associated with the N_th test item is not completed (NO in S350), a second partial test operation is performed on the N_th test item.

When the total test operation associated with the N_th test item is completed (YES in S350), the test on the DUTs 311~31q, . . . , 3p1~3pq ends (S400).

Figure 16:
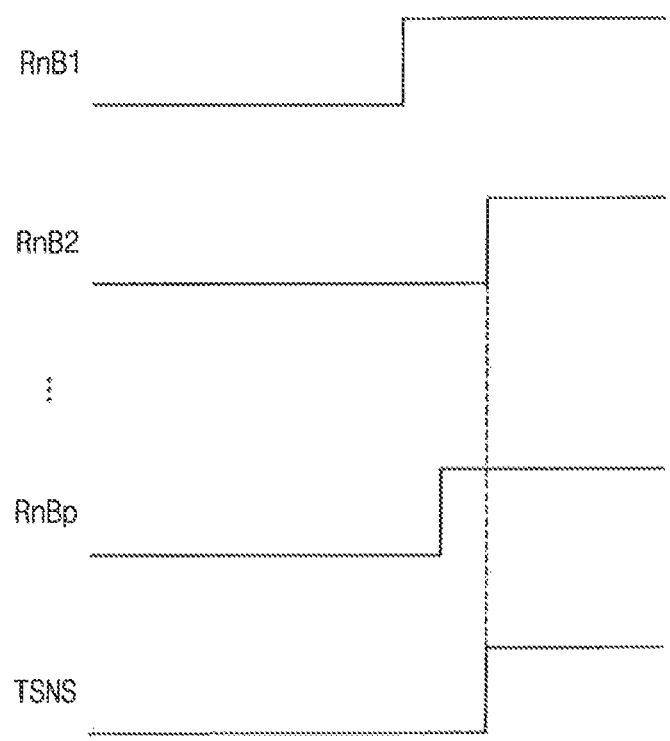
FIG. 16 illustrates a relationship between a status signal and a timing synchronization signal in the test system of FIG. 1 according to an exemplary embodiment of the inventive concept.

FIG. 16 illustrates a relationship between a status signal and a timing synchronization signal in the test system of FIG. 1 according to an exemplary embodiment of the inventive concept.

Referring to FIG. 16, the timing synchronization signal TSNS is activated after all of the status signal RnB1~RnBp transit to a high level. The sequence controller 190 in each of the unit boards 100a~100p may control a test sequence of test items based on the timing synchronization signal TSNS. The unit boards 100a~100p may perform a test on the DUTs in the DUTSs 311~31q, . . . , 3p1~3pq in a corresponding one of the groups individually and may synchronize a test sequence of a plurality of test items with respect to one another based on the timing synchronization signal TSNS.

Figure 17:
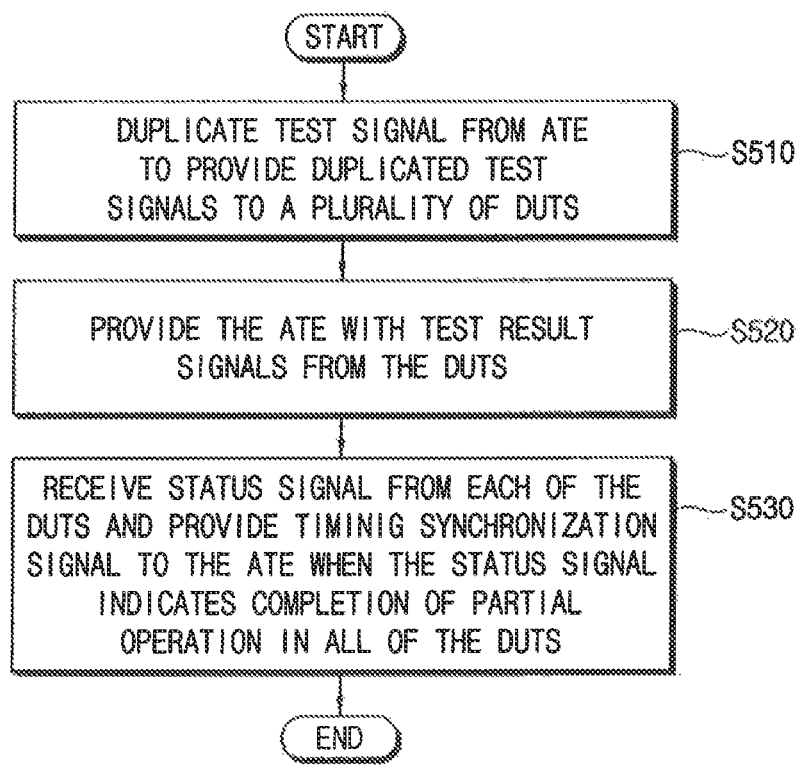
FIG. 17 is a flowchart illustrating a method of operating a test interface board according to an exemplary embodiment of the inventive concept.

FIG. 17 is a flowchart illustrating a method of operating a test interface board according to an exemplary embodiment of the inventive concept.

Referring to FIGS. 1 through 17, in a method of operating the test interface board 200 electrically connected to the plurality of DUTs 311~31q, . . . , 3p1~3pq, the test interface board 200 duplicates the test signal TS from the ATE 20 to provide the plurality of duplicated test signals DTS11~DTS1q, . . . , DTSp1~DTSpq to the DUTSs 311~31q, . . . , 3p1~3pq (S510).

The test interface board 200 provides the ATE 20 with the plurality of test result signals TRS11~TRS1q, . . . , TRSp1~TRSpq received from the DUTSs 311~31q, . . . , 3p1~3pq, which respond to the duplicated test signals DTS11~DTS1q, . . . , DTSp1~DTSpq (S520).

The test interface board 200 receives the plurality of status signals RnB1~RnBp from the DUTSs 311~31q, . . . , 3p1~3pq to provide the timing synchronization signal TSNS to the ATE 20 (S530). Each of the status signals RnB1~RnBp indicates a completion of a test operation in each of the DUTSs 311~31q, . . . , 3p1~3pq, where the test operation is associated with the test signal TS, and the timing synchronization signal TSNS is activated when all of the status signals RnB1~RnBp indicate the completion of the test operation.

The ATE 20 may synchronize the test sequence of a plurality of test items on the DUTSs 311~31q, . . . , 3p1~3pq based on the timing synchronization signal TSNS.

Figure 18:
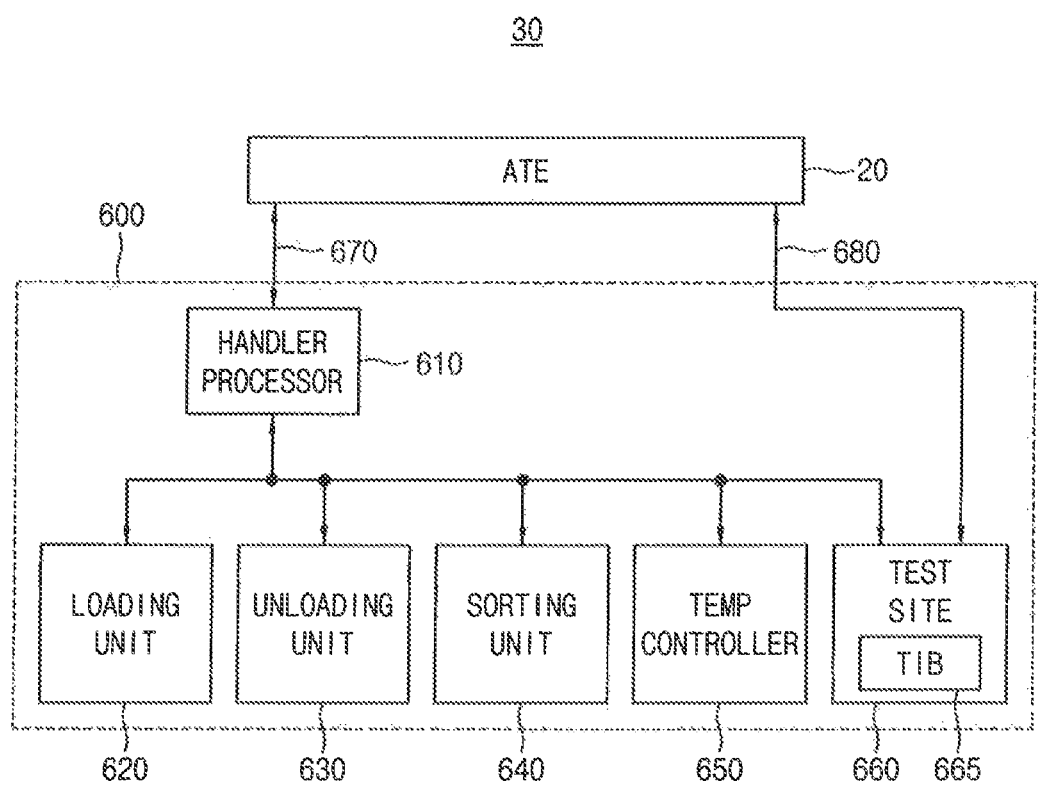
FIG. 18 is a block diagram illustrating a test system according to an exemplary embodiment of the inventive concept.

FIG. 18 is a block diagram illustrating a test system according to an exemplary embodiment of the inventive concept.

Referring to FIG. 18, a test system 30 includes the ATE 20 and a handler 600.

The handler 600 may include a handler processor 610, a loading unit 620, an unloading unit 630, a sorting unit 640, a test site temperature controller 650, and a test site 660, for example. The test site 660 may include a test interface board 665. The handler 600 is an automated testing robot independently controlled by the handler processor 610 that communicates with a processor in the ATE 20.

The loading unit 620 may load the DUTs from the outside and move the DUTs to the test site 660 therein. The unloading unit 630 may convey the tested DUTs to the outside. The sorting unit 640 may receive the electrical test results from the ATE 20 through an information signal cable 670 to determine whether the DUT is acceptable or not.

The test site temperature controller 650 may control a temperature of an area where the DUTs are tested. For example, the test site 660 may be at high temperature, a room temperature, or a low temperature, to test whether the semiconductor device performs correctly regardless of changes in the temperature. The test site 660 is an area electrically connecting the DUTs with the ATE 20 through the test board 300 in FIG. 1, and is connected to the ATE 20 via a test signal cable 680.

The handler 600 loads the DUTs from outside and is connected to the ATE 20 via the information signal cable 670 and the test signal cable 680. The handler 600 carries the DUTs on sockets of the test interface board 665 on the test site 660, and after that, transmits a test start signal to the ATE 20. When the handler 600 receives a test ending signal from the ATE 20, the handler 600 discriminates the DUTs on the sockets and unloads the DUTs according to the test result, for example, "passed" or "failed," received with the test ending signal.

Figure 19:
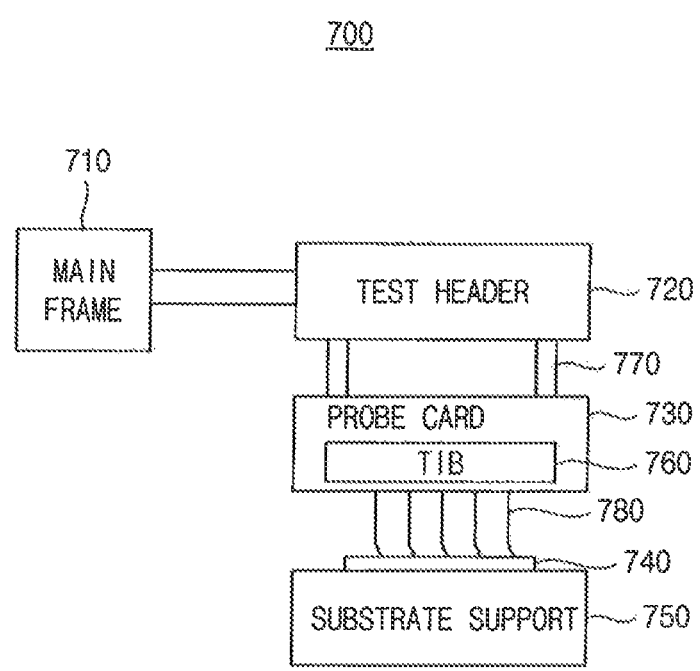
FIG. 19 is a block diagram illustrating a test system according to an exemplary embodiment of the inventive concept.

FIG. 19 is a block diagram illustrating a test system according to an exemplary embodiment of the inventive concept.

Referring to FIG. 19, a test system 700 includes a test main frame 710, a test header 720, a probe card 730, a wafer 740, and a substrate support 750. The wafer 740 may include a plurality of semiconductor devices that are to be tested.

The test main frame 710 may generate a test signal, and may receive test result signals generated by the semiconductor devices formed in the wafer 740. In exemplary embodiments of the inventive concept, the test header 720 may move up and down such that the probe card 730 may be easily attached to the test header 720 and the wafer 740 may be easily mounted on the substrate support 750. In exemplary embodiments of the inventive concept, the substrate support 750 may move up and down while the test header 720 is fixed. In exemplary embodiments of the inventive concept, both of the test header 720 and the substrate support 750 may move up and down together. The test main frame 710, the test header 720, and the substrate support 750 may form an ATE.

The probe card 730 may include a connector 770, probe needles 780, and a test interface board 760. The connector 770 may connect the test header 720 to the probe card 730, and the probe needles 780 may connect the probe card 730 to pads of the semiconductor devices. In exemplary embodiments of the inventive concept, the test interface board 760 transmits test signals from the connector 770 to the probe needle 780 through relay circuits. In addition, the test interface board 760 transmits test result signals from the probe needle 780 to the connector 770 through relay circuits.

In addition, the test interface board 760 may include a synchronization signal generator that generates a timing synchronization signal based on status signals from the probe needle 780 and transmits the timing synchronization signal to the connector 770. Therefore, the test system 700 may perform a test on the semiconductor devices individually and may synchronize a test sequence of a plurality of test items with respect to one another based on the timing synchronization signal.

Exemplary embodiments of the inventive concept may be employed by test systems to test semiconductor devices.

Accordingly, according to the above-described exemplary embodiments of the inventive concept, unit boards in the ATE may perform a test on the DUTs in a corresponding one of the groups individually, and may synchronize a test sequence of a plurality of test items with respect to one another based on a timing synchronization signal provided from the test interface board.

While the inventive concept has been particularly shown and described with reference to exemplary embodiments thereof, it will be understood by those of ordinary skill in the art that various changes in form and details may be made thereto without departing from the spirit and scope of the inventive concept as set forth by the following claims.

What is claimed is:

1. A test interface board comprising:
one or more relay circuits configured to duplicate a test signal from an automated test equipment (ATE), configured to apply a plurality of duplicated test signals to each of a plurality of devices under test through one of corresponding channels, and configured to provide the ATE with a plurality of test result signals received from each of the devices under test in response to the plurality of duplicated test signals; and
a synchronization signal generator configured to receive a plurality of status signals from each of the plurality of devices under test and configured to provide a timing synchronization signal to the ATE,
wherein each of the plurality of status signals indicates a completion of a test operation in one of the plurality of devices under test,
the test operation is associated with the test signal, and
the synchronization signal generator is further configured to activate the timing synchronization signal when all of the plurality of status signals indicate the completion of the test operation.

2. The test interface board of claim 1, wherein the synchronization signal generator includes an AND gate configured to receive the plurality of status signals, to perform an AND operation on the plurality of status signals, and to output the timing synchronization signal.

3. The test interface board of claim 1, wherein the synchronization signal generator includes a field programmable gate array (FPGA) element configured to receive the plurality of status signals and to output the timing synchronization signal that is activated when each of the plurality of status signals has a first logic level.

4. The test interface board of claim 3, wherein the FPGA element is programmable based on a number of the plurality of devices under test.

5. The test interface board of claim 1, wherein each of the one or more relay circuits are connected to a corresponding group of devices under test of the plurality of devices under test, and
wherein each of the one or more relay circuits includes:
a buffer configured to duplicate the test signal to provide a corresponding duplicated test signal among the plurality of duplicated test signals;
first relays configured to provide the corresponding duplicated test signal to the corresponding group of devices under test through first wiring lines, in response to a first switching control signal; and
second relays configured to provide the ATE with corresponding test result signals of the plurality of test result signals and corresponding status signals of the plurality of status signals from the corresponding group of devices under test through second wiring lines, in response to a second switching control signal, and
wherein the synchronization signal generator receives the corresponding status signals through third wiring lines.

6. The test interface board of claim 5, further including:
a switching signal generator configured to generate the first switching control signal and the second switching control signal in response to a control signal from the ATE.

7. The test interface board of claim 6, wherein the switching signal generator is configured to substantially simultaneously provide the first switching control signal to the one or more relay circuits and configured to substantially simultaneously provide the second switching control signal to the one or more relay circuits.

8. The test interface board of claim 6, wherein the switching signal generator is further configured to generate the first switching control signal and the second switching control signal based on the timing synchronization signal.

9. A test system comprising:
an automated test equipment (ATE) configured to generate a test signal; and
a test interface board configured to receive the test signal, wherein the test interface board is configured to:
duplicate the test signal, and apply a plurality of duplicated test signals to each of a plurality of devices under test through one of corresponding channels, wherein the plurality of devices under test are divided into a plurality of groups of devices under test;
provide the ATE with a plurality of test result signals received from each of the devices under test in response to the plurality of duplicated test signals; and
receive a plurality of status signals from each of the plurality of devices under test and provide a timing synchronization signal to the ATE, wherein each of the plurality of status signals indicates a completion of a test operation in one of the plurality of devices under test, the test operation is associated with the test signal, and the timing synchronization signal is activated when all of the plurality of status signals indicate the completion of the test operation.

10. The test system of claim 9, wherein the test interface board includes:
a plurality of relay circuits configure to connect the ATE to the plurality of group of devices under test; and a synchronization signal generator configured to receive the plurality of status signals to activate the timing synchronization signal based on logic levels of the plurality of status signals and to provide the timing synchronization signal to the ATE.

11. The test system of claim 10, wherein the synchronization signal generator includes an AND gate configured to receive the plurality of status signals, to perform an AND operation on the plurality of status signals, and to output the timing synchronization signal.

12. The test system of claim 10, wherein the synchronization signal generator includes a field programmable gate array (FPGA) element configured to receive the plurality of status signals and to output the timing synchronization signal that is activated when each of the plurality of status signals has a first logic level, and
the FPGA element is programmable based on a number of the plurality of devices under test.

13. The test system of claim 10, wherein each of the plurality of relay circuits includes:
a buffer configured to duplicate the test signal to provide a corresponding duplicated test signal among the plurality of duplicated test signals;
first relays configured to provide the corresponding duplicated test signal to a corresponding group of devices under test through first wiring lines, in response to a first switching control signal; and
second relays configured to provide the ATE with corresponding test result signals of the plurality of test result signals and corresponding status signals of the plurality of status signals from the corresponding group of devices under test through second wiring lines, in response to a second switching control signal,
wherein the synchronization signal generator receives the corresponding status signals through third wiring lines, and
wherein the test interface board further includes a switching signal generator configured to generate the first switching control signal and the second switching control signal in response to a control signal from the ATE.

14. The test system of claim 9, wherein each of the plurality of devices under test includes a nonvolatile memory device, and
the nonvolatile memory device is configured to output a corresponding status signal of the plurality of status signals with a first logic level when the nonvolatile memory device completes a partial test operation associated with one of a plurality of test items, in response to a corresponding duplicated test signal of the plurality of duplicated test signals.

15. The test system of claim 9, wherein the ATE includes a plurality of unit boards corresponding to the plurality of groups, and
wherein a synchronization signal generator is configured to substantially simultaneously provide the plurality of unit boards with the timing synchronization signal that is activated.

16. The test system of claim 15, wherein each of the plurality of unit boards includes:
a plurality of pin electronics (PE) boards corresponding to devices under test in a corresponding one of the plurality of groups;
a matching controller configured to generate a match signal based on pass/fail information signals received from the plurality PE boards; and
a sequence controller configured to provide the plurality PE boards with a sequence control signal in response to the match signal and the timing synchronization signal, wherein the sequence control signal controls a test sequence of a plurality of test items.

17. The test system of claim 16, wherein each of the plurality PE boards includes:
a plurality of function circuits; and
a processor configured to control the plurality of function circuits in response to the sequence control signal,
wherein each of the plurality of function circuits is configured to:
output the test signal associated with devices under test in the corresponding one of the plurality of groups;
receive corresponding test result signals and corresponding status signals from the devices under test in the corresponding one of the plurality of groups; and
generate the pass/fail information signals indicating test results of the devices under test in the corresponding one of the plurality of groups based on the corresponding test result signals.

18. The test system of claim 15, wherein the plurality of unit boards are configured to perform a test on devices under test in a corresponding one of the plurality of groups individually and are configured to synchronize a test sequence of a plurality of test items with respect to one another based on the timing synchronization signal.

19. A method of operating a test interface board electrically connected to a plurality of devices under test, the method comprising:
duplicating a test signal from an automated test equipment (ATE) to provide a plurality of duplicated test signals to each of the plurality of devices under test;
provide the ATE with a plurality of test result signals received from each of the plurality of devices under test in response to the plurality of duplicated test signals; and
receiving a plurality of status signals from each of the plurality of devices under test to provide a timing synchronization signal to the ATE, wherein each of the plurality of status signals indicates a completion of a test operation in one of the plurality of devices under test, the test operation is associated with the test signal, and the timing synchronization signal is activated when all of the plurality of status signals indicate the completion of the test operation.

20. The method of claim 19, wherein
each of the plurality of devices under test includes a nonvolatile memory device,
the nonvolatile memory devices is configured to output a corresponding status signal of the plurality of status signals with a first logic level when the nonvolatile memory device completes a partial test operation associated with one of a plurality of test items, in response to a corresponding duplicated test signal of the plurality of duplicated test signals, and
the nonvolatile memory device includes a status signal generator configured to generate the corresponding status signal.

* * * * *